United States Patent [19]
Rairden, III

[11] 3,979,534
[45] Sept. 7, 1976

[54] PROTECTIVE COATINGS FOR DISPERSION STRENGTHENED NICKEL-CHROMIUM/ALLOYS

[75] Inventor: John R. Rairden, III, Niskayuna, N.Y.

[73] Assignee: General Electric Company, Schenectady, N.Y.

[22] Filed: July 26, 1974

[21] Appl. No.: 492,070

[52] U.S. Cl............................... 427/405; 427/253; 29/197
[51] Int. Cl.²...................... B05D 1/38; C23C 11/00
[58] Field of Search........... 117/71 M, 107, 107.2 P; 29/197, 194; 427/405, 383, 376, 253

[56] References Cited
UNITED STATES PATENTS 3,594,219  7/1971  Maxwell et al. ...................... 29/197
3,764,371  10/1973  Baldi ................................ 117/71 M

*Primary Examiner*—Cameron K. Weiffenbach
*Attorney, Agent, or Firm*—F. Wesley Turner; Joseph T. Cohen; Jerome C. Squillaro

[57] ABSTRACT

A method of forming a high temperature oxidation resistant coating on a thoria dispersion strengthened nickel-chromium alloy body is provided. The method includes applying to the surface of the body a first coating of metallic cobalt, diffusing the cobalt into the body, and thereafter subjecting the body to a second coating of aluminum.

5 Claims, 2 Drawing Figures

PROTECTIVE COATINGS FOR DISPERSION STRENGTHENED NICKEL-CHROMIUM/ALLOYS

It is well known to strengthen metals by means of chemically inert dispersions such as oxide particles. A discussion on oxide dispersion strengthened nickel alloys is set forth by G. S. Ansell et al., *Oxide Dispersion Strengthening*, Gordon and Beach, New York, 1968. The primary interest in dispersion strengthened materials is based on their stability at very high temperatures. Dispersion strengthened nickel alloys are useful in fabrication of aircraft gas turbine engines. Other uses of dispersion strengthened nickel alloys include thermocouple sheaths, tensile-test grips, and various types of furnace hardware.

Typically the dispersed oxide phase is added to the metal by powder metallurgy techniques. The dispersion of thoria in a nickel matrix (TD NICKEL) accomplished by a coprecipitation process was described by Anders et al., *Met. Prog.*, 88, (Dec. 1972). The thorium oxide is suspended in a solution from which nickel hydroxide is precipitated. After drying and reduction, a fine dispersion of thorium oxide is present in a nickel matrix. This dispersion strengthening substantially increases the high temperature mechanical properties, while having no effect on the physical properties of the nickel base alloy.

A major requirement for alloys used in high temperature sections of aircraft gas turbines is resistance to surface degradation. Ever increasing temperature requirements have led to the use of oxidation resistant coatings for surface protection. It was reported by L. A. Monson et al., Technical Report, AFMLTR-66-47, Part I, March 1966, that aluminide coatings on TD NiCr and TD Ni were extremely porous. Porosity has been attributed to the unequal diffusivities of nickel and aluminum, with nickel leaving the substrate and diffusing outward faster than aluminum diffuses inward from the surface. This unequal diffusion flux results in vacancies which appear to coalesce, probably on the few larger thoria particles forming voids. Spalling of the coatings is associated with porosity at the coating-substrate interface.

It is therefore an object of the present invention to provide a dense, adherent aluminized coating on a dispersion strengthened nickel-chromium alloy.

In accordance with the present invention, I have discovered a method of improving the high temperature oxidation resistance of a dispersion strengthened nickel-chromium alloy by initially forming a first coating on the surface of the body with cobalt, then heat treating the body to diffuse a portion of the cobalt into the substrate and finally forming an aluminizing coating over the first coating. The aluminized coating is characterized as being dense, nonporous and adherently bonded to the substrate.

The invention is more clearly understood from the following description taken in conjunction with the accompanying drawing in which.

Figure 1:
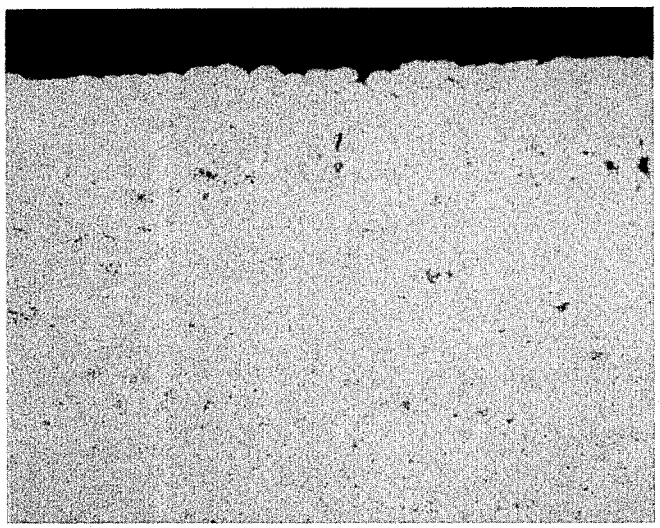
FIG. 1 is a photomicrograph (500X) of a TD NiCr body pretreated with a cobalt coating and aluminized according to the method of my invention.

The dispersion strengthened substrates useful in the present invention have been described hereinabove and are further discussed in C. T. Sims et al., *The Superalloys*, John Wiley, New York, 1972, Pages 197–230. The dispersion strengthened nickel-chromium alloy commercially available include the following:

TABLE I

| Composition | Trade Name |
|---|---|
| Ni-20 w/o Cr-2 to 3 v/o ThO$_2$ | TD NiCr |
|  | DS NiCr |
| Ni-16 w/o Cr-4 w/o Al-2 v/o ThO$_2$ | TD NiCrAl |
| Ni-20 w/o Cr-1.5 w/o Al-2.5 w/o Ti-2.5 v/o Y$_2$O$_3$ | IN 853 |

These oxide dispersion strengthened nickel-chromium alloys have strength properties superior to those of conventional superalloys at temperatures in excess of 1100°C.

The cobalt layer for oxide dispersion strengthened nickel-chromium base alloys, e.g. TD NiCr, must be sufficiently thick so as to provide cobalt atoms for diffusion into the substrate such that the cobalt concentration is greater than about 2 weight percent to at least the depth of the subsequent aluminizing overcoat. Typically, aluminizing layers extend from 1 to 3 mils into the substrate. Therefore, as a rule-of-thumb, it is preferred that the deposited cobalt layer be at least 0.1 mils thick per mil thickness of aluminized coating so that an average cobalt concentration of 10 weight percent can be achieved on the surface of the substrate by heat treatment. The cobalt coating is applied to the substrate by a physical vapor deposition technique which is described in considerable detail in *Vapor Deposition*, Edited by C. F. Powel et al., John Wiley, New York (1966). Accordingly, the coating is evaporated and deposited in a vacuum chamber. Typically, the metal alloy is heated by an electron beam focused on a metal alloy ingot to evaporate the metal to a vapor. During evaporation, the vapor condenses as a coating, preferrably about 0.1 to 0.3 mil in thickness on the workpiece being coated.

The cobalt coated alloy is then subjected to a heat treatment at a temperature and for a time sufficient to cause the cobalt atoms to migrate into the substrate to the required depth for the subsequent aluminized coating. Because diffusion coefficients of cobalt in the various alloy substrates are not fully known, the proper cobalt heat treatment may typically be determined by routine experimentation.

Thereafter the cobalt coated body is aluminized to form a layer preferably 1.0 to 3.0 mils thick. The aluminide coating is applied to the substrate by chemical vapor deposition using a technique designated as pack cementation. This involves placing the substrate in a metal or graphite retort containing a mixture of an inert oxide filler or diluent, a halide salt, and a source of aluminum. The inert filler supports the article to be coated and the retort is usually sealed with sand or low melting glass powder. On heating, the salt decomposes and reacts with the aluminum to form a gaseous aluminum halide which serves to transfer the aluminum to the surface of the substrate alloy. A preferred type of aluminide pack cementation coating useful in the present invention is the high activity pack containing about 3–20% by weight of aluminum. The most practical activator is a halide salt selected from NaF, KF, NH$_4$Cl, and NH$_4$F in an amount of about 0.1–10% by weight of the mixture. The preferred inert filler is a refractory alumina powder which comprises about 10–96% by weight of the total pack. A representative pack contains in weight percent of about 5.8% Al, 0.2% $NH_4F$ and the balance $Al_2O_3$.

My invention is further illustrated by the following example.

A thoria dispersion strengthened nickel-chromium alloy sheet (TD NiCr Type DMM, Fansteel) 1/16 in. thick was cut into coupons about 1/5 in. × ¾ in. These were placed in a vacuum deposition chamber and a coating of pure cobalt about 0.2 mil thick was deposited on one side of the alloy coupon. The coupon was then heat treated for 1½ hours at 1160°C in an argon atmosphere to diffuse the cobalt into the surface region of the alloy. Thereafter the coupon was placed in an Inconel 600 retort containing an aluminizing powder pack consisting of 5.8% Al, 96% $Al_2O_3$ and 0.2% $NH_4F$. The aluminizing process used was 3 hours at 1160°C in a slowly flowing pure argon atmosphere.

After aluminizing, the sample was cross-sectioned and metallographically examined. FIG. 1 shows the aluminized coating on the cobalt pretreated surface as prepared by the described process. It was observed that the aluminized coating obtained was dense, nonporous and adhered satisfactorily to the substrate.

Figure 2:
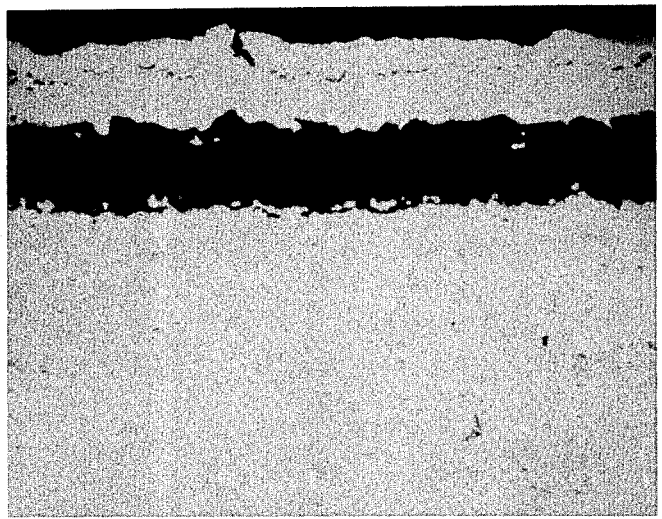
FIG. 2 is a photomicrograph (500X) of a TD NiCr body after aluminization without a cobalt coating pretreatment.

However, a sample was prepared in which the cobalt pretreatment was omitted. The results are shown in FIG. 2. It was observed that there was a lack of bonding between the coating and the sample which was not pretreated with cobalt.

It will be appreciated that the invention is not limited to the specific details shown in the example and illustrations and that various modifications may be made within the ordinary skill in the art without departing from the spirit and scope of the invention.

I claim:

1. A method of improving the high temperature oxidation resistance of a thoria dispersion strengthened nickel-chromium alloy body comprising, in sequence the steps of:
    a. physical vapor deposition of a first coating consisting essentially of cobalt to a surface of said body,
    b. heat treating the coated body to a temperature sufficient to diffuse at least a portion of the first coating into the surface of said body, and
    c. subjecting the coated body to a pack cementation vapor deposition to form a second coating comprising aluminum on said body, said second coating being substantially nonporous and adherent to said body.

2. The method of claim 1, wherein said alloy consists essentially of about 20% by weight of chromium, the balance nickel, and 2–3% by volume thoria dispersed therein, said first coating is deposited to a thickness of about 0.1–0.3 mils, and said second coating is deposited to a thickness of about 1.0–3.0 mils.

3. The method of claim 2, wherein said alloy consists essentially of about 16% by weight of chromium, 4% by weight of aluminum, the balance nickel and about 2% by volume of thoria dispersed therein.

4. The method of claim 2, wherein said alloy consists essentially of about 20% by weight of chromium, 1.5% by weight of aluminum, 2.5% by weight of titanium, the balance nickel, and about 2.5% by volume of yttria dispersed therein.

5. The method of claim 4, wherein said body is coated with cobalt to a thickness of about 0.2 mil, said first coated body is heat treated at a temperature of about 1160°C. for about 1.5 hours in an argon atmosphere to diffuse the cobalt into the surface of the alloy, and thereafter the body is aluminized at a temperature of about 1160°C. for about 3 hours.

* * * * *